United States Patent [19]

Imazeki et al.

[11] 4,445,199
[45] Apr. 24, 1984

[54] PORTABLE BUBBLE MEMORY APPARATUS

[75] Inventors: Ryoji Imazeki, Hachioji; Hidetsugu Komiya; Michiya Inoue, both of Hino, all of Japan

[73] Assignee: Fujitsu Fanuc Limited, Tokyo, Japan

[21] Appl. No.: 282,270

[22] Filed: Jul. 10, 1981

[30] Foreign Application Priority Data

Jul. 15, 1980 [JP] Japan .................... 55-96388

[51] Int. Cl.³ .......................................... G11C 19/08
[52] U.S. Cl. ........................................................ 365/1
[58] Field of Search ................ 365/1, 2; 360/60, 96.5

[56] References Cited

U.S. PATENT DOCUMENTS

| 3,947,883 | 3/1976 | Suzuki | 360/96.5 |
| 4,156,934 | 5/1979 | Burford | 365/2 |
| 4,308,593 | 12/1981 | Young et al. | 365/1 |
| 4,400,795 | 8/1983 | Irie et al. | 365/1 |

FOREIGN PATENT DOCUMENTS

| 27337 | 4/1981 | European Pat. Off. | 365/1 |
| 914247 | 12/1962 | United Kingdom | 360/60 |

OTHER PUBLICATIONS

Electronics-vol. 54, No. 9; May 5, 1981, pp. 149-151.

Primary Examiner—James W. Moffitt
Attorney, Agent, or Firm—Staas & Halsey

[57] ABSTRACT

A portable bubble memory apparatus having a bubble memory cassette for accommodating a bubble memory element, and a portable cassette adapter provided with a cassette holder for loading and unloading the bubble memory cassette, the portable cassette adapter housing a control circuit and peripheral circuitry for the bubble memory element. A signal generator generates a signal to indicate whether the bubble memory cassette has been loaded at the correct position within the cassette holder. If the bubble memory cassette is displaced from the correct position, the generated signal causes the exchange of information between the bubble memory cassette and an external unit to cease. Additionally, if the bubble memory cassette is displaced from its correctly loaded position the electrical connection between the bubble memory cassette and the portable cassette adapter is maintained at least for a period of time, measured from the generation of the signal, required for the bubbles in the bubble memory to shift to a predetermined position, thereby preventing the loss of information stored in the bubble memory element.

6 Claims, 5 Drawing Figures

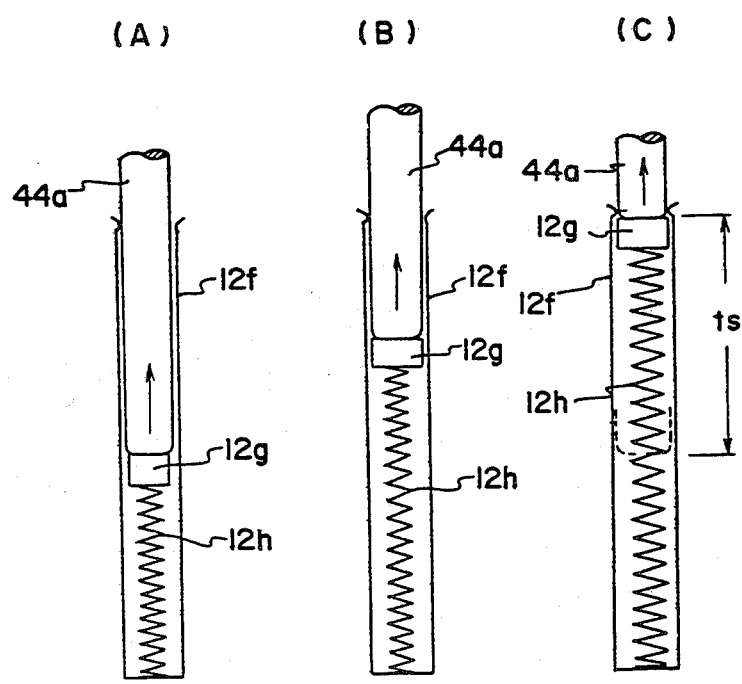

PORTABLE BUBBLE MEMORY APPARATUS

BACKGROUND OF THE INVENTION

This invention relates to a portable-type bubble memory apparatus, and more particularly to a bubble memory apparatus so adapted as to prevent the loss of information stored in the bubble memory even if the bubble memory cassette is inadvertently or abruptly withdrawn from a portable cassette adapter.

Numerical control devices for controlling machine tools have recently been adapted to employ bubble memories rather than paper tapes as the storage medium. These bubble memories are magnetically driven and therefore require comparatively expensive equipment to enable the bubble memory element to be used as the storage medium. Such equipment includes peripheral circuitry composed of a driver for driving a coil located within the bubble memory element and for driving a variety of gates, a sense amplifier for reading outputs, a function driver and a timing circuit, as well as a control circuit for controlling data read and write operations. The apparatus that utilizes the conventional bubble memory is therefore provided with (1) a bubble memory cassette having a bubble memory element, and (2) a portable cassette adapter which contains the control circuit, the peripheral circuitry and a holder for holding the inserted bubble memory cassette and for establishing electrical contact with the cassette, the cassette adapter responding to commands from the numerical control device to read information from the bubble memory cassette and to write information into memory. To reduce costs, it is so arranged that a single portable cassette adapter can be used in common by individual numerical control devices, the adapter being designed in such a manner that bubble memory cassettes storing different kinds of numerical control information can be exchanged merely by ejecting one cassette and replacing it with another.

In the bubble memory cassette apparatus of the above type, the bubble memory cassette can be withdrawn from the portable cassette adapter at any time. However, since the bubble memory cassette accommodates neither the coil driver for generating a revolving magnetic field for bubble transfer, nor a back-up power source which renders the coil driver operative for a predetermined period of time, sudden withdrawal of the bubble memory cassette during a shift of bubbles within the major and minor loops in the bubble memory may cause a shifting bubble to stop short somewhere within a loop, so that the data stored in memory may not be preserved correctly.

SUMMARY OF THE INVENTION

Accordingly, it is an object of the present invention is to provide a novel arrangement that will not allow data stored in a bubble memory to be lost regardless of how or when a bubble memory cassette is withdrawn from a portable cassette adapter.

Another object of the present invention is to provide a novel arrangement wherein a signal is generated when a portable bubble memory cassette is displaced from its correctly loaded position, the electrical connection between the bubble memory cassette and the cassette adapter being maintained for a predetermined period of time measured from the point in time at which said signal is generated.

Other features and advantages of the invention will be apparent from the following description taken in connection with the accompanying drawings.

BRIEF DESCRIPTION OF THE DRAWINGS

FIGS. 3(A) through 3(C) are illustrative views which are useful in describing how a connector pin is withdrawn from a receptacle.

DESCRIPTION OF THE PREFERRED EMBODIMENT

Figure 1:
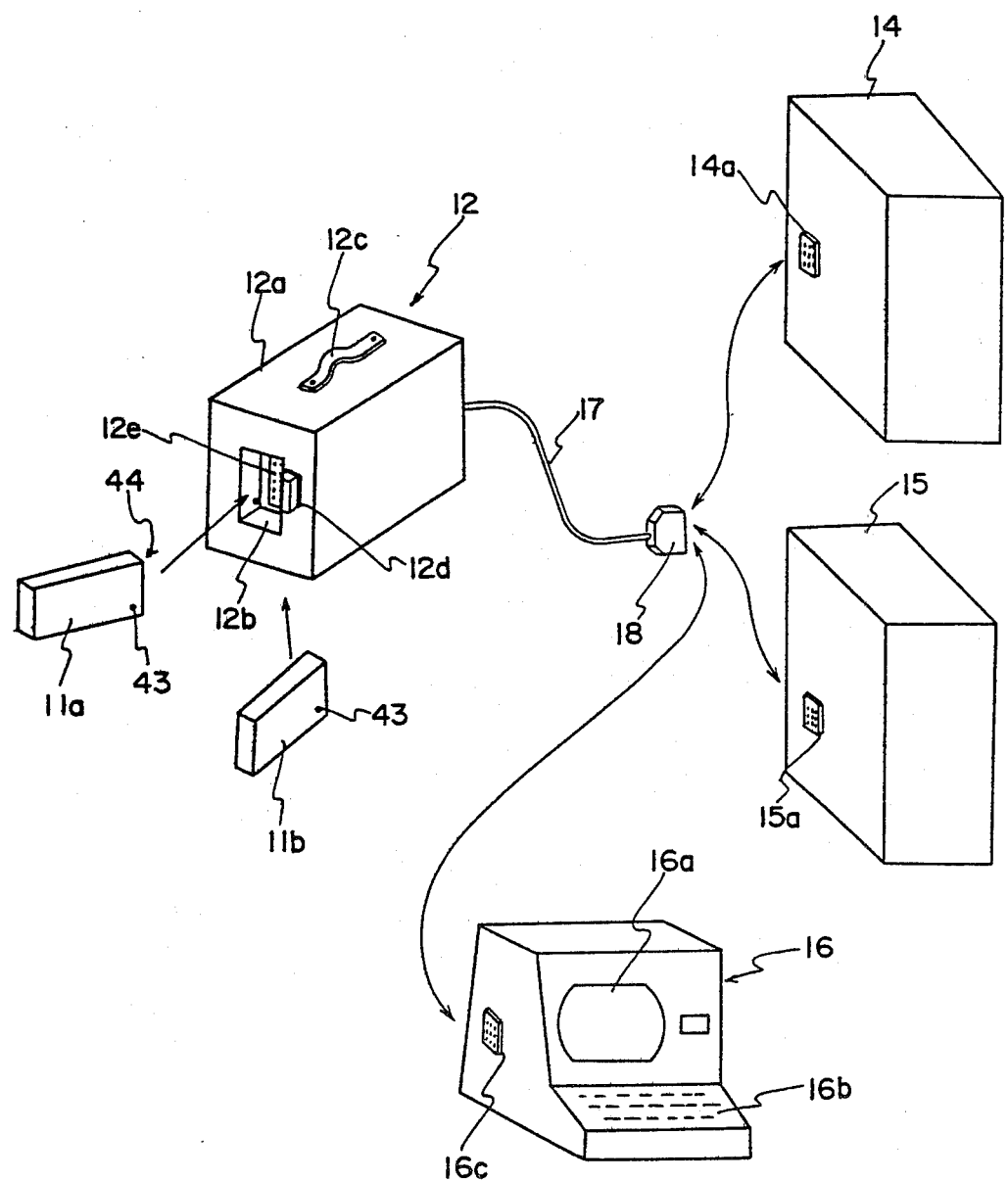
FIG. 1 is an illustrative view which is useful in describing a portable memory apparatus in accordance with the present invention.

Referring first to FIG. 1, numerals 11a, 11b each denote a cassette-type storage medium (referred to as a bubble memory cassette hrereafter) having a bubble memory element. A portable cassette adapter 12 has a casing 12a which accommodates the abovementioned peripheral circuitry and control circuit, and which is formed to include a cassette holder 12b for retaining a bubble memory cassette 11a or 11b inserted therein, and for providing electrical connection to the housed peripheral circuitry and control circuit. The casing 12a is small in size and is provided at its top with a handle 12c for easy carrying, so that the entire cassette adapter 12 is portable. Further, an eject leve 12d is provided on the side of the cassette holder, the lever being used to eject a bubble memory cassette which has been inserted into the holder 12b. Numerical control (NC) devices are indicated by numerals 14 and 15. The NC devices include a built-in memory for storing a part program, as well as receptacles 14a, 15a, respectively, which are installed in the casing to make possible electrical connection between the NC device and the cassette adapter 12 via a cable and plug mentioned below. A programming apparatus 16, for the purpose of writing a part program into the bubble memory cassettes 11a, 11b, includes a display section 16a and a keyboard 16b, as well as a receptacle 16c which is installed in the casing to make possible electrical connection between the programming apparatus 16 and the cassette adapter 12 through the cable and plug. The cable, denoted by numeral 17, has one end thereof connected directly to the circuitry housed within the cassette adapter, and has the other end thereof connected to a connector 18 which is adapted to be plugged into any of the receptacles 14a, 15a, or 16c. Thus, the cable 17 and connector 18 enable an exchange of signals and information between the cassette adapter 12, specifically the peripheral circuitry and control circuit housed within the cassette adapter 12, and either of the NC devices 14 or 15, or programming apparatus 16, and permit a part program to be read from or written into either of the bubble cassettes 11a, 11b.

In operation, assume that the NC device 14 is to execute numerically controlled machining using a part program which has been stored in the bubble memory cassette 11a. In this case the bubble memory cassette 11a is inserted into the cassette holder of the cassette adapter 12, and the connector 18 is plugged into the receptacle 14a of the NC device 14. This establishes the electrical connection between the bubble memory cassette 11a and the portable cassette adapter 12, and between the portable cassette adapter 12 and the NC device 14. Once these connections have been made the part program stored in the bubble cassette 11a is transferred to and stored in the memory that is built in the NC device 14. The NC device 14 then executes a numerical control operation on the basis of the part program. Similarly, if the NC device 15 is to execute numerically controlled machining using the part program stored in the bubble memory cassette 11a, the connector 18 is plugged into the receptacle 15a to transfer and store the program in the NC device 15 as described above. Furher, a numerically controlled machining operation on the basis of a part program stored in the bubble memory cassette 11b can be carried out merely by inserting the bubble memory cassette 11b into the cassette holder 12a. To exchange cassettes, the eject lever 12d is depressed to eject the bubble memory cassette, accommodated within the cassette holder 12b, to a position where it can be removed by hand. The operator then withdrawn the ejdcted cassette from the cassette holder 12a and forcibly inserts a new bubble memory cassette into the cassette holder until the cassette is received at the operating position.

Figure 2:
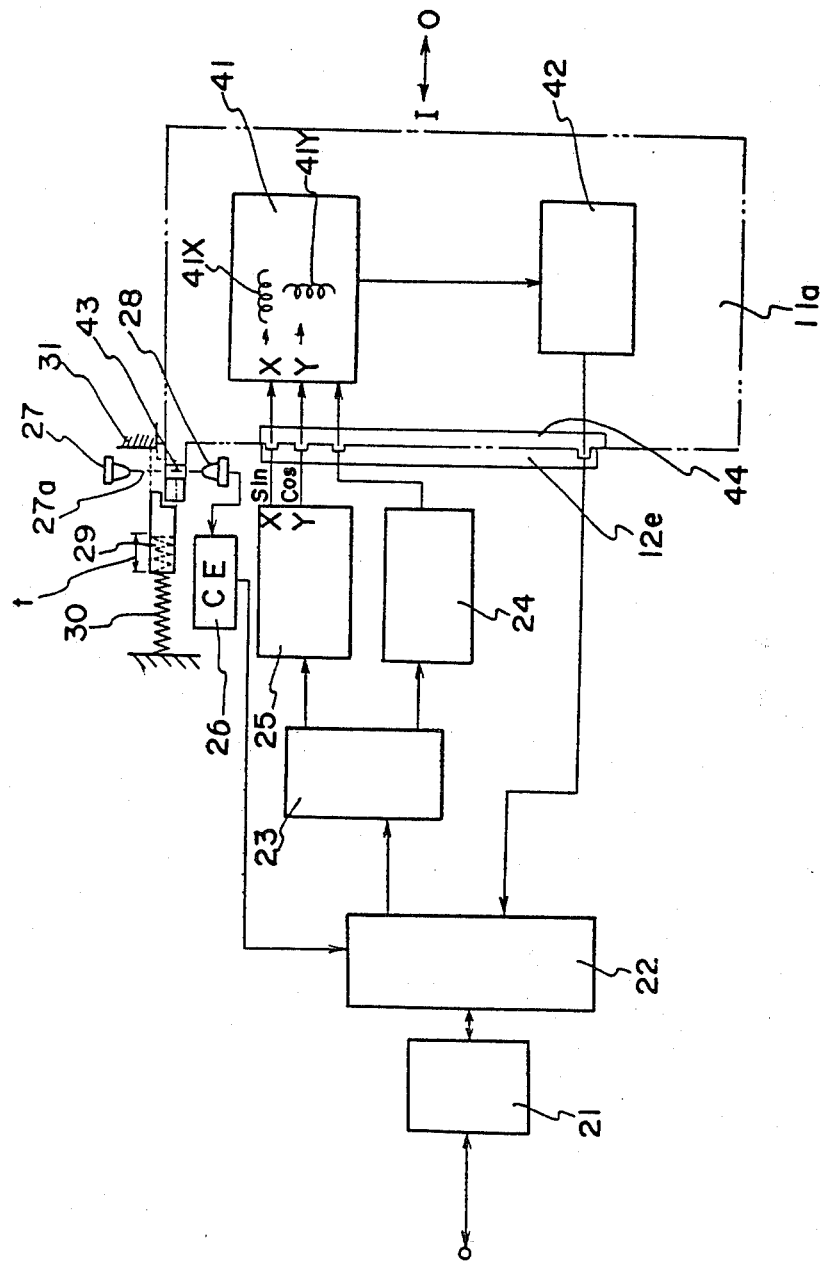
FIG. 2 is a block diagram of a portable cassette adapter and a bubble memory cassette.

FIG. 2 is a block diagram showing the principal components constituting the portable cassette adapter 12 and a bubble memory cassette, such as the bubble memory cassette 11a. Specifically, the portable cassette adapter includes an interface circuit 21, for the connection to the NC devices or to the programming apparatus, a control circuit 22 for generating a variety of necessary signals and for controlling write signal inputs and the delivery of read signals and the like, a timing circuit 23, a function driver 24, timed by the timing circuit 23, for producing signals that enable signal read and write operations, and a coil driver 25, timed by the timing circuit 23, for generating two sinusoidal signals each having a frequency of 100 kHz, the signals differing in phase by 90°. This point will be described in detail later. Numerical 26 denotes a warning signal generating circuit, 29 a light interrupting plate, 30 a spring for forcibly moving the light interrupting plate 29, and 31 a stopper for halting the movement of the light interrupting plate.

The bubble memory cassette 11a includes a bubble memory module 41, and a sense amplifier 42 for reading out the data stored in the bubble memory module 41. A portion of the case housing the bubble memory cassette 11a is provided with a light transmissive aperture 43. When the bubble memory cassette 11a is loaded and correctly positioned within the cassette adapter, a beam of light emitted by a light-emitting element 27 passes through the aperture 43 and impinges upon a light-receiving element 28, as will be described in greater detail below. The light transmissive aperture 43 is provided at the front end portion of the bubble memory cassette 11a, i.e., that end which is inserted into the cassette holder 12b, as shown in FIG. 1, and is bored in a direction which is different from that in which the cassette 11a is moved, the direction of cassette movement being depicted by the arrows I, O in FIG. 2. Further, the front end portion of the bubble memory cassette 11a is provided with a connector 44, and the recessed wall of the cassette holder 12b that faces the front end of the inserted bubble memory cassette is provided with a receptacle 12e for receiving the connector 44.

The bubble memory module 41 has drive coils 41X, 41Y for converting, into a revolving magnetic field, the two sinusoidal currents, having the phase difference of 90°, obtained from the coil driver 25.

The apparatus of the present invention operates as follows.

The light-interrupting plate 29 will be forcibly held in abutting contact with the stopper 31 by means of the spring 30 if a bubble memory cassette has not been inserted into the cassette holder 12b. The beam of light from the light-emitting element 27 is therefore intercepted by the light-interrupting plate 29 and does not reach the light-receiving element 28. Since the latter cannot issue a signal under those conditions, the control circuit 22 produces a signal that inhibits operation of the coil driver 25, so that the latter cannot produce the sinusoidal currents that drive the bubbles in the bubble memory.

Assume now that the bubble memory cassette 11a is inserted into the cassette holder 12b to mate the connector 44 with the receptacle 12e, thereby to establish an electrical connection between the portable cassette adapter 12 and the bubble memory cassette 11a. Following insertion of the cassette, the front end portion thereof will have moved the light-interrupting plate 29 against the force of the spring 30 by the distance t from the position indicated by the dotted lines to a retracted position indicated by the solid lines, as illustrated in FIG. 2, the cassette coming to rest at the specified location. With the bubble memory cassette 11a so situated, a beam of light 27a from the light-emitting element 27 is permitted to impinge upon the light-receiving element 28 via the light transmissive aperture 43. The light-receiving element 28 responds by sending a signal to the warning signal generating circuit 26, which in turn responds by delivering an enable signal EC to the control circuit 22. This signal enables the control circuit 22 so that the control circuit may respond to inputs as required. When data stored in the bubble memory module 41 starts to be read, or when data starts to be written into the bubble memory module 41, the sinusoidal currents displaced in phase by 90° are generated by the coil driver and applied to the drive coils 41X, 41Y, so that the revolving magnetic field that drives the bubbles in the memory is revolved from a specified phase, say from the 0° position. As the magnetic field makes one revolution, bubbles in the major and minor loops are shifted by one bit.

When the read or write operation is completed, the transmission of the sinusoidal currents from the coil driver 25 ends, and the magnetic field vanishes after the revolution thereof has halted at the 0° position. This action of the revolving magnetic field assures that bubbles will be advanced accurately by one bit without the shifting of the bubbles being stopped prematurely.

If the eject lever 12d is depressed accidentally to cause sudden ejection of the bubble memory cassette 11a while a read or write operation is in progress, the light-transmissive aperture 43 will no longer be in alignment with the light beam 27a, so that the body of the bubble memory cassette 11a will interrupt the light beam. This causes the light-receiving element 28 to stop transmitting the enable signal CE, thereby informing the control circuit 22 that the bubble memory cassette has been displaced from the loaded position. In other words, the change in state represented by the loss of the enable signal CE constitutes a warning signal received by the control circuit.

The control circuit 22, upon receipt of the warning signal, causes the delivery of the sinusoidal currents to continue until the magnetic field within the bubble memory module 41 has been revolved to the predetermined position. Meanwhile, when the connector 44 is pulled out from the receptacle 12e, a pin at the end of the connector 44 is held in contact with a contact portion on the receptacle 12 for a period of time no less than that necessary for the magnetic field to make at least one revolution. To this end, in accordance with the present invention as illustrated in FIG. 3(A), the tip of the connector pin, designated by numeral 44a, depresses a spring-loaded back-up contactor 12g when the pin 44a is inserted into the cylindrical contact portion 12f of the receptacle 12e (FIG. 2), the back-up contactor 12g being electrically connected to the contact portion 12f at all times. When the pin 44a is withdrawn in the direction of the arrow, the back-up contactor 12g is urged upward by the compressed spring 12h and remains in contact with the pin 44a as it ascends together with the pin, as depicted in FIG. 3(B). Thus the electrical connection between the pin 44a and the contact portion 12f is continuously maintained even if the pin 44a and contact portion 12f are momentarily out of contact. The magnetic field for driving the bubbles in the bubble memory will make one complete revolution before stopping. This takes place during the time period $t_s$ that is required for the base of the pin 44a to completely clear the contact portion 12f, as shown in FIG. 3(C).

The operation described above take place in the same manner if a bubble memory cassette loaded in the cassette holder 12b is touched accidentally and caused to move.

An arrangement for maintaining contact between the connector 44 and the receptacle 12e during at least one revolution of the magnetic field for driving the bubbles is not limited to the embodiment described above. It is obvious that means ordinarily employed in the switch and connector field can be adopted. Furthermore, the mechanism that senses movement of the cassette need not necessarily do so directly, as in the foregoing embodiment. Instead, the mechanism can be provided on the ejector portion and adapted to sense operation of the ejector lever, thereby sensing cassette movement indirectly.

In accordance with the present invention as described in detail above, means are provided for generating a warning signal which indicates that the bubble memory cassette has been moved from its correctly loaded position, as when the cassette is being withdrawn from the portable cassette adapter. The generation of the warning signal permits the electric current that drives the bubbles within the bubble memory cassette to be applied to the cassette for a predetermined time period which starts when said signal is generated, thereby assuring that there will be no disruption of the data stored in the bubble memory cassette.

As many apparently widely different embodiments of this invention may be made without departing from the spirit and scope thereof, it is to be understood that the invention is not limited to the specific embodiments thereof except as defined in the appended claims.

What is claimed is:

1. A portable bubble memory apparatus which comprises:

a bubble memory cassette for accommodating a bubble memory element;

a portable cassette adapter for connecting to said bubble memory cassette which includes a control circuit for controlling said bubble memeory cassette and executing an exchange of data therewith;

signal generating means for generating a warning signal when said bubble memory cassette is displaced from its correctly loaded position, said warning signal indicating that said bubble memory cassette has been displaced; and means responsive to the bubble memory cassette being displaced from its correctly loaded position, for disabling the control circuit and for maintaining the electrical connection between said bubble memory cassette and said portable cassette adapter at least for a period of time required for the bubbles in the bubble memory to shift to a predetermined position, said time period beginning with the generation of the warning signal.

2. A portable bubble memory apparatus which comprises:

a bubble memory cassette for accommodating a bubble memory element, said bubble memory cassette having a light-transmissive aperture through a portion thereof and extending in a direction different from that in which said bubble memory cassette moves;

a portable cassette adapter which includes a control circuit for being connected to said bubble memory cassette to execute an exchange of data therewith, said portable cassette adapter having a receptacle;

a light-emitting element provided in the proximity of said receptacle;

a light-receiving element provided in the proximity of said receptacle for receiving light emitted from said light-emitting element;

the light emitted from said light-emitting element impinging upon said light-receiving element through the light-transmissive aperture when said bubble memory cassette is in the loaded state within said receptacle; and means for disabling the control circuit within said portable cassette adapter when the light impinging upon said light-receiving element is interrupted by movement of said bubble memory cassette from its correctly loaded position.

3. A portable bubble memory apparatus according to claim 2, further comprising a light interrupting plate means normally located at a first position where said light interrupting plate interrupts the light emitted from said light-emitting element, said light interrupting plate being movable in the direction of movement of said bubble memory cassette, wherein when said bubble memory cassette is inserted in said receptacle, said light interrupting plate is moved by said bubble memory cassette away from said first position to a second position at which the light from said light-emitting element is not interrupted thereby.

4. A portable bubble memory apparatus according to claim 1 or 2, wherein said bubble memory cassette includes revolving means for generating a revolving magnetic field, and said control circuit further includes coil driving means for driving said revolving means, said coil driving means operates, in response to said bubble memory being displaced from its correctly loaded position, until said revolving magnetic field is rotated to a predetermined position.

5. A portable bubble memory apparatus which comprises:

a bubble memory cassette for accommodating a bubble memory element, said bubble memory cassette having a connector having at least one contact portion and a light-transmissive aperture through a portion of said bubble memory cassette and extending in a direction different from that in which said bubble memory cassette moves, said connector having a first contactor;

a portable cassette adapter which includes a control circuit for being connected to said bubble memory cassette to execute an exchange of data therewith, said portable cassette adapter having a receptacle, said receptacle having a second contactor;

a light-emitting element provided in the proximity of said receptacle; and a light-receiving element provided in the proximity of said receptacle for receiving light emitted from said light-emitting element;

wherein, when said bubble memory cassette, loaded in said receptacle, is separated from said receptacle, the second contactor of said connector, which is in contact with the first contactor of said receptacle, is separated from the first contactor after said bubble memory cassette interrupts the light impinging upon said light-receiving element from said light-emitting element.

6. A portable bubble memory apparatus according to claim 5, further comprising a back-up contactor loaded by a spring within a cylindrically shaped contact portion in the receptacle of said portable cassette adapter, and a pin provided on the connector of said bubble memory cassette, wherein, when said pin is being withdrawn from said cylindrically shaped contact portion, contact between said pin and said back-up contactor is maintained at least for a period of time required for a revolving magnetic field, which drives bubbles in said bubble memory element, to make one complete revolution.

* * * * *